(12) United States Patent
Previtali et al.

(10) Patent No.: US 8,021,986 B2
(45) Date of Patent: Sep. 20, 2011

(54) METHOD FOR PRODUCING A TRANSISTOR WITH METALLIC SOURCE AND DRAIN

(75) Inventors: Bernard Previtali, Grenoble (FR); Thierry Poiroux, Voreppe (FR); Maud Vinet, Rives (FR)

(73) Assignee: Commissariat à l'énergie atomique et aux energies alternatives, Paris (FR)

( * ) Notice: Subject to any disclaimer, the term of this patent is extended or adjusted under 35 U.S.C. 154(b) by 0 days.

(21) Appl. No.: 12/796,282

(22) Filed: Jun. 8, 2010

(65) Prior Publication Data
US 2011/0003443 A1    Jan. 6, 2011

(30) Foreign Application Priority Data
Jun. 25, 2009  (FR) ..................... 09 54350

(51) Int. Cl.
*H01L 21/302*    (2006.01)
(52) U.S. Cl. ........ 438/738; 438/706; 438/735; 438/924; 257/E21.249; 257/E21.44; 257/E21.507
(58) Field of Classification Search ................. 438/706, 438/735, 738, 740, 924; 257/383, 900, E21.249, 257/E21.44, E21.507
See application file for complete search history.

(56) References Cited

U.S. PATENT DOCUMENTS

| | | | |
|---|---|---|---|
| 6,080,661 A | 6/2000 | Bothra | |
| 2003/0008496 A1 | 1/2003 | Deleonibus | |
| 2006/0286363 A1 | 12/2006 | Nishi et al. | |
| 2007/0092990 A1 | 4/2007 | Belyansky et al. | |
| 2008/0026513 A1 | 1/2008 | Costrini et al. | |
| 2008/0254580 A1 | 10/2008 | Dutartre et al. | |
| 2009/0079004 A1 | 3/2009 | Licitra et al. | |
| 2009/0101972 A1 | 4/2009 | Gaines et al. | |
| 2010/0025773 A1 | 2/2010 | Lenoble et al. | |

FOREIGN PATENT DOCUMENTS

| | | |
|---|---|---|
| EP | 1 650 796 A2 | 4/2006 |
| EP | 1 788 635 A1 | 5/2007 |
| FR | 2 915 023 | 10/2008 |
| WO | WO 01/95383 A1 | 12/2001 |
| WO | WO 2004/019383 A2 | 3/2004 |
| WO | WO 2005/008744 A2 | 1/2005 |
| WO | WO 2007/060641 A1 | 5/2007 |

OTHER PUBLICATIONS

French Search Report issued Feb. 18, 2010 in FR 0954350.

*Primary Examiner* — Thanh V Pham
(74) *Attorney, Agent, or Firm* — Oblon, Spivak, McClelland, Maier & Neustadt, L.L.P.

(57) ABSTRACT

A method for producing a transistor with metallic source and drain including the steps of:
 a) producing a gate stack,
 b) producing two portions of a material capable of being selectively etched relative to a second dielectric material and arranged at the locations of the source and of the drain of the transistor,
 c) producing a second dielectric material-based layer covering the stack and the two portions of material,
 d) producing two holes in the second dielectric material-based layer forming accesses to the two portions of material,
 e) etching of said two portions of material,
 f) depositing a metallic material in the two formed cavities,
 and also including, between steps a) and b), a step of deposition of a barrier layer on the stack, against the lateral sides of the stack and against the face of the first dielectric material-based layer.

14 Claims, 14 Drawing Sheets

METHOD FOR PRODUCING A TRANSISTOR WITH METALLIC SOURCE AND DRAIN

TECHNICAL FIELD

The invention relates to the field of integrated circuits, and in particular that of field effect transistors. The invention more particularly concerns a method for producing a field effect transistor of the MOS type with metallic source and drain.

BACKGROUND OF THE INVENTION

Producing a high performance and/or low consumption MOS transistor involves reducing the access resistance of that transistor as much as possible, i.e. the electrical resistance from the electric contacts connected to the source and the drain of the transistor until the channel of the transistor, in order to increase the current delivered by the transistor, and therefore improve the performance thereof.

The access resistance of a transistor is made up of three components:
- the resistance of the extension regions, i.e. regions situated on the lateral sides of the channel and that are in electric contact with the source and the drain,
- the resistance of the source and the drain,
- the resistance of the electric contacts connected to the source and the drain of the transistor.

To reduce the resistance of the extension regions, it is known to produce these extension regions from an alloy of metal and doped semiconductor, called silicide when the semiconductor forming the channel of the transistor is silicon-based. The penetration of that alloy in the semiconductor portion is very sensitive to the dispersion of the initial thickness of the semiconductor layer from which the channel is realized, which causes strong dispersions on the characteristics of the transistor. In order to improve the control of the penetration of the alloy under the spacers that are formed against the lateral sides of the transistor gate, above the channel, i.e. to improve the segregation of the dopants closest to the channel, it may be wise to etch the semiconductor intended to form the channel directly above the spacers and to realize a lateral siliconizing of the semiconductor which is therefore independent of the thickness of the semiconductor layer.

In order to reduce the access resistance of the transistor, it is also known to realize the source and the drain of the transistor from a metallic material.

Document EP 1 788 635 B1 describes the realization of a dual-gates MOS transistor with metallic source and drain. In the method described by this document, the channel is etched directly above the spacers and extension regions of the channel are implanted by dopants, then siliconized. Cavities are realized on the sides of the gate-channel structure by the deposition and planarization of one or several dielectric materials, then a lithography and an etching of those materials. A metal is then deposited on the whole of the structure, thereby filling the cavities. This metal is then planarized with stop on the hard mask having been used to produce the gate, thereby eliminating the metal region electrically connecting the source and the drain which are formed by the portions of metal arranged in the cavities.

This method has several drawbacks:
- it is not possible to perform a siliconization of the gate,
- the hard mask used to form the gate is also the stop layer of at least one chemical-mechanical polishing done in the active region of the transistor,
- the control of this planarization must be perfect, in particular at the active region-isolation region (the active region corresponding to the region of the transistor where the channel, source and drain are situated, and the isolation region corresponding to the rest of the transistor) transition path because the risk of short circuit is significant if metallic portions persist after the planarization, in particular due to the fact that the gate-channel structure at the active region is thicker than the stack of materials found at the isolation region of the channel.

Document WO 01/95383 A1 describes a method for producing transistors with metallic source and drain in which, after lateral siliconization of the sides of the channels, a metal is deposited over the entire surface of the wafer to make it possible to later take back the electric contacts of the source and drain. At this moment in the production method, all of the transistors are in internal short circuit (source-drain electric contact via the metal passing above the gate) and in short circuit with each other (via the metal passing above the isolation regions).

To eliminate the various short circuits (source-drain and inter-transistors), a chemical-mechanical planarization (CMP) is done with stop on the hard mask of the gate, then lithography and etching steps are done to eliminate short circuits between the transistors.

This approach has the following drawbacks in particular:
- if the etching is done after the CMP, this requires significant selectivity of etching of the metal in relation to the present materials, for example relative to the hard mask of the $SiO_2$ and/or $Si_3N_4$-based gate. It is consequently not possible to perform the etching from chlorinated and/or fluorinated solutions,
- if the etching is done before the CMP, the thickness of metal to be etched is not consistent over the entire wafer. It is in particular more significant at the active region-isolation region transition paths, which causes the formation of metal spacers around the paths, and in particular around the gate material found in the isolation region, forming a short circuit between the source and the drain.

BRIEF DESCRIPTION OF THE INVENTION

There is therefore a need to propose a method for producing a field effect transistor of the MOS type having a very low access resistance, which does not present the drawbacks of the methods of the prior art previously mentioned.

For this, we propose a method for producing a transistor with metallic source and drain including at least the steps of:
a) producing, on one face of a first dielectric material-based layer, at least one stack comprising at least one portion of at least one semiconductor material designed to form a channel of the transistor, a gate dielectric arranged against the portion of semiconductor material and a gate arranged against the gate dielectric,
b) producing, on the face of the first dielectric material-based layer, at least two portions of a material capable of being selectively etched relative to at least one second dielectric material and arranged at the locations of the source and drain of the transistor, the volume of each of said two portions of material corresponding at least to the volume of the source or of the drain of the transistor,
c) producing a second dielectric material-based layer covering at least the stack and said two portions of material,
d) producing at least two holes in the second dielectric material-based layer, each hole forming an access to one of said two portions of material, e) etching of said two portions of material, forming two cavities whereof the volumes correspond to the volumes of the source and of the drain of the transistor, f) depositing at least one metallic material in said two cavities, forming at least the metallic source and drain of the transistor.

In this method, one forms, under each source and drain contact, cavities having dimensions essentially similar to those of the source and drain of the transistor one wishes to obtain, and corresponding to the dimensions of the portions of material capable of being selectively etched relative to the dielectric material of a layer deposited on those portions. This integration of metallic source and drain is therefore risk-free for the gate stack because the method does not require any chemical-mechanical planarization step with stop on the hard mask of the gate, in particular in the active region of the transistor.

Moreover, this method also makes it possible to offset a certain misalignment appearing during lithography implemented to produce electric contacts of the source and of the drain during the methods of the prior art. Indeed, given that the production of the source and drain regions is dissociated from the production of the channel, it is therefore possible, by using masking of the active region for example overdimensioned to form the source and drain regions relative to the dimensions of the active region, to offset this misalignment owing to the overdimensioning of the mask.

Moreover, no problem controlling planarization of metal appears during the implementation of this method for producing a transistor because this method does not involve the implementation of any chemical-mechanical planarization that is delicate to control, unlike the methods of the prior art in which a planarization done at the active region-isolation region transition paths is very difficult to perform without causing a short circuit of the transistor.

This method also makes it possible to reduce the access resistances relative to the transistors of the prior art given that the channel and the extension regions are semiconductor-based and that the source and drain regions are metallic material-based (the resistivity of which is lower than that of the semiconductor).

This method also makes it possible to perform a siliconization of the gate because the same stack is present on the source and drain regions, and on the top of the gate.

Lastly, when the transistor includes at least one hard mask, this method has the advantage of not including any planarization step using this hard mask as stop layer.

It should also be noted that this method is compatible with planar dual-gates and FD-SOI technologies.

Step b) for producing said two portions of material may be obtained by carrying out the following steps:
  deposition of a layer composed of the material capable of being selectively etched relative to the second dielectric material on the face of the first dielectric material-based layer and on the stack,
  etching of the layer composed of the material capable of being selectively etched relative to the second dielectric material, a remaining portion of said layer composed of the material capable of being selectively etched relative to the second dielectric material covering the stack and the locations of the source and the drain,
  etching of said remaining portion, forming said two portions of material.

The deposition of the layer composed of the material capable of being selectively etched relative to the second dielectric material may be of the non-conformal PECVD (plasma-enhanced chemical vapor deposition) type.

The method may also include, between the step of etching of the layer composed of the material capable of being selectively etched relative to the second dielectric material and the step of etching of said remaining portion, the performance of the following steps:
  deposition of a first layer composed of the second dielectric material, covering at least said remaining portion,
  chemical-mechanical planarization of the first layer composed of the second dielectric material with stop on said remaining portion,
  step c) for producing the second dielectric material-based layer corresponding to a deposition of a second layer composed of the second dielectric material in a trench formed during the etching of said remaining portion and on the first layer composed of the second dielectric material, and a planarization of the second layer composed of the second dielectric material.

The method may also include, between steps a) and b), a step of depositing, on the stack, against the lateral sides of the stack and against the face of the first dielectric material-based layer, a layer composed of a material capable of forming a barrier to a diffusion of corrosive elements released during a metal deposition, said two portions of material being produced, during step b), against the layer composed of the material capable of forming a diffusion barrier. Such a barrier layer makes it possible in particular to protect the semiconductor designed to form the channel against corrosive elements released during the metal depositions. Furthermore, given that the deposition of the barrier layer is done before the formation of the cavities, it is possible to implement regular cleaning techniques between silicide and diffusion barrier, thereby making it possible to benefit from optimized contact resistances in a transistor produced in this way.

The method may also include, between the step of etching of the layer composed of the material capable of being selectively etched relative to the second dielectric material and the step of etching of said remaining portion, and before the step of depositing a first layer composed of the second dielectric material covering at least said remaining portion when the method includes such a step, a step of etching of the layer composed of the material capable of forming a diffusion barrier, a remaining portion of the layer composed of the material capable of forming a barrier covering the stack and the locations of the source and the drain.

The method may also include, between the step of etching of said remaining portion forming said two portions of material and step c) for producing the second dielectric material-based layer, a step of etching of the layer composed of the material capable of forming a diffusion barrier or the remaining portion of said layer, producing at least two disjointed portions of material capable of forming a diffusion barrier each covering one of the locations of the source or of the drain.

The step of etching of said remaining portion forming said two portions of material may be an isotropic etching.

One dimension of each of said two portions of material along an axis perpendicular to a plane passing through said face of the first dielectric material-based layer may be smaller than a dimension of the stack along said axis. Thus, the height of one of the cavities in which the source and the drain are produced may be less than the height of the gate and its potential hard mask.

The material capable of being selectively etched relative to the second dielectric material may also be capable of being selectively etched relative to the materials present on the first dielectric material-based layer before the performance of etching step e), and/or may be composed of SiN and/or silicon and/or germanium.

The material capable of forming a diffusion barrier may be composed of TiN and/or Ti and/or TaN.

The stack may also include a hard mask arranged against the gate.

The transistor may be of the FD-SOI type (fully depleted on substrate of the silicon-on-insulator type), or more generally a single-gate MOS transistor.

The stack may also include a second gate arranged against the first dielectric material-based layer and a second gate dielectric arranged between the second gate and the portion of semiconductor material. Generally, this method for producing a transistor may be applied for any dual-gates MOS transistor.

The metallic material deposited during step f) may also be deposited in the two holes formed in the second dielectric material-based layer, forming metallic contacts electrically connected to the source and the drain of the transistor. Thus, it is possible to produce the electric contacts of the transistor from the same metal as that used to produce the source and the drain of the transistor, and/or to produce these electric contacts and the source and the drain during a same metal deposition step.

BRIEF DESCRIPTION OF THE DRAWINGS

The present invention will be better understood upon reading the description of embodiments provided purely for information and in no way limitingly in reference to the appended drawings in which.

Identical, similar or equivalent parts of the various figures described below bear the same numerical references so as to facilitate the passage from one figure to another.

The different parts illustrated in the figures are not necessarily illustrated using a uniform scale, to make the figures more legible.

The different possibilities (alternatives and embodiments) must be understood as not being exclusive of one another and can be combined.

DETAILED DESCRIPTION OF SPECIFIC EMBODIMENTS

Figure 1A:
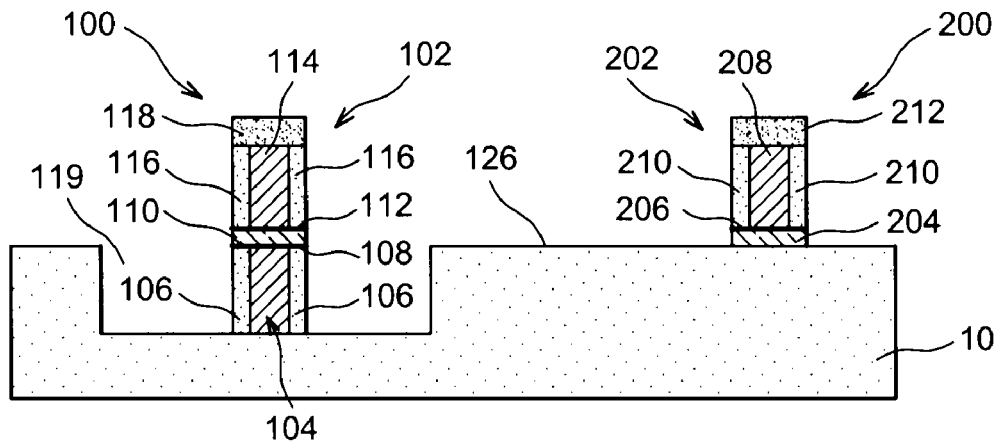
FIGS. 1A to 1Q illustrate the steps of a method for producing transistors with metallic sources and drains according to a first embodiment.
Figure 1B:
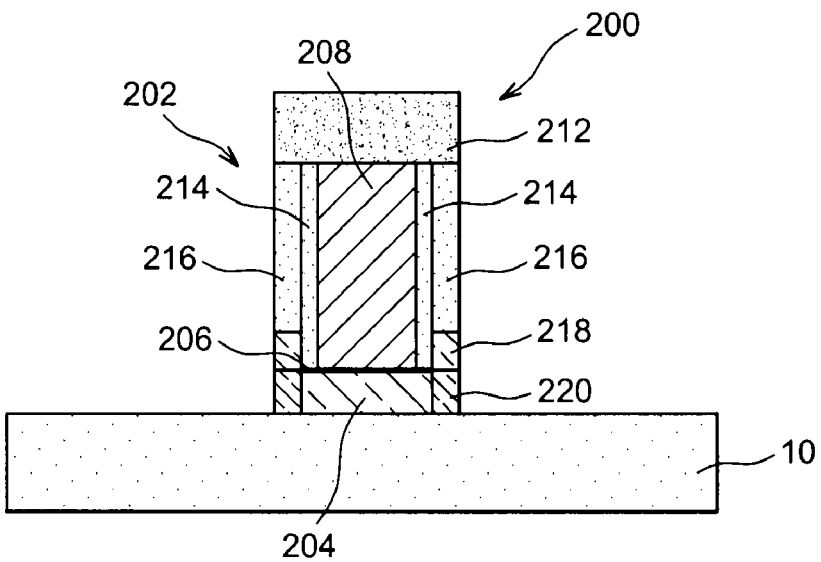
Figure 1C:
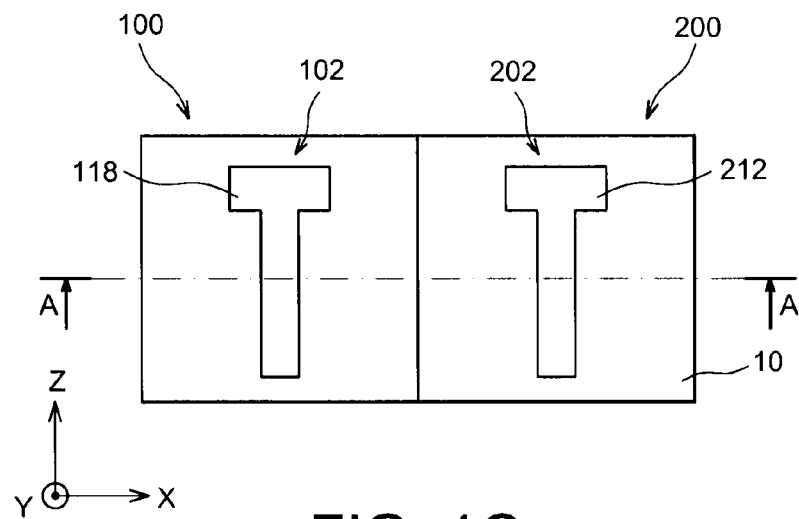
Figure 1D:
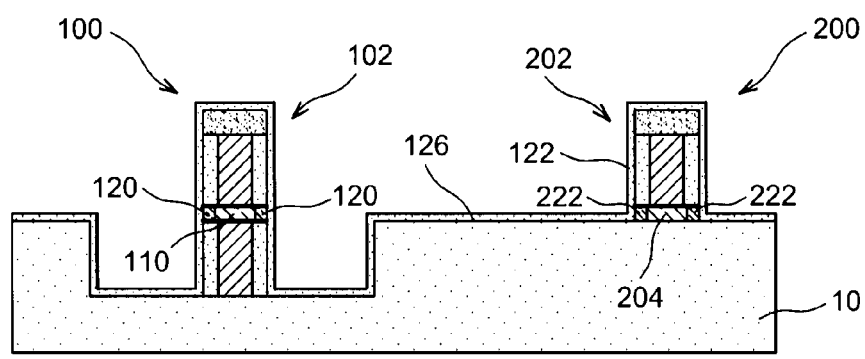
Figure 1E:
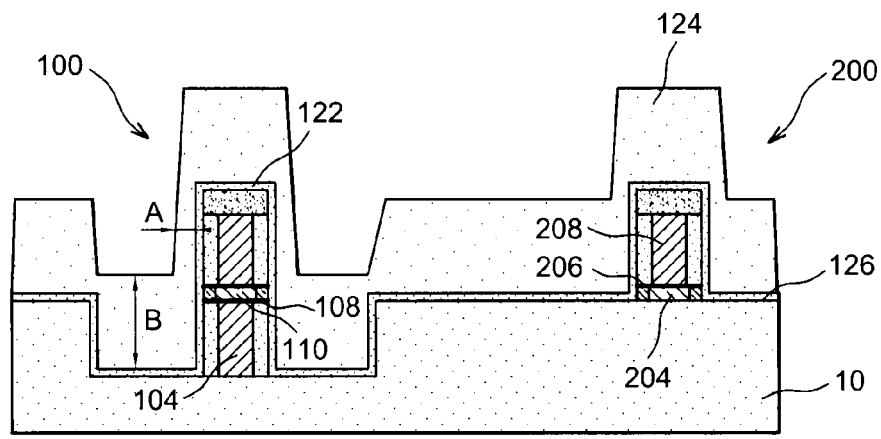
Figure 1F:
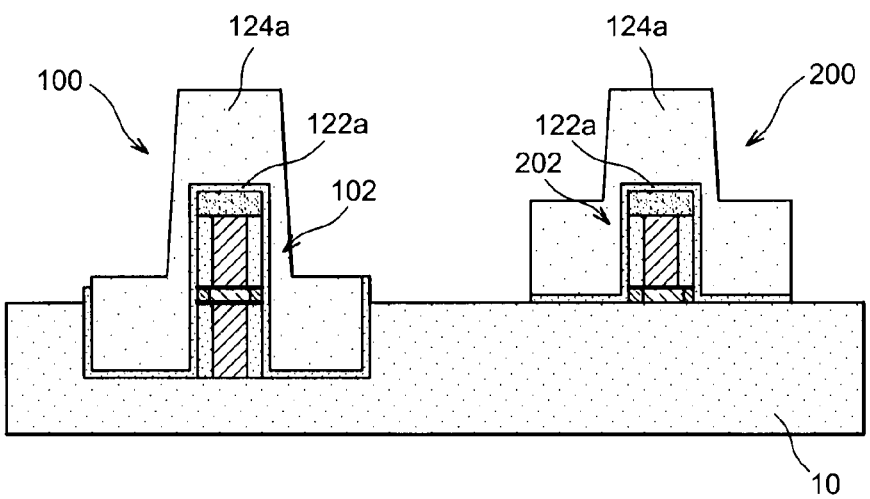
Figure 1G:
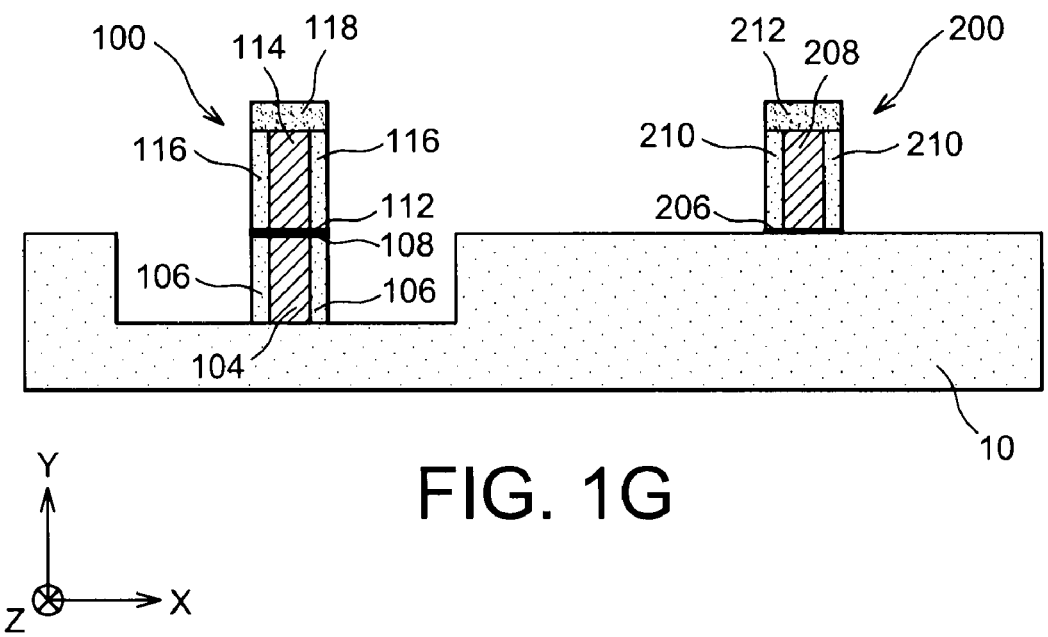
Figure 1H:
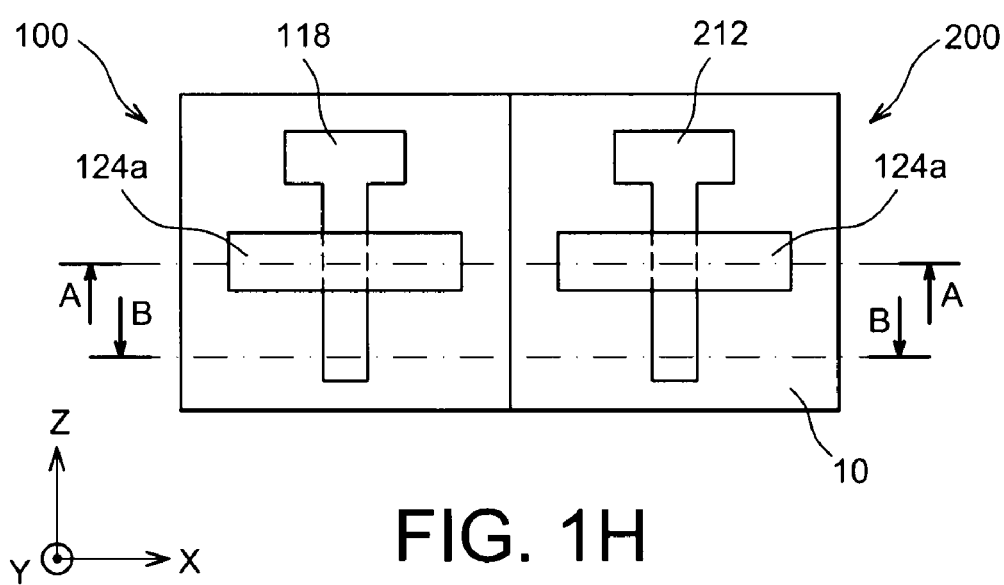
Figure 1I:
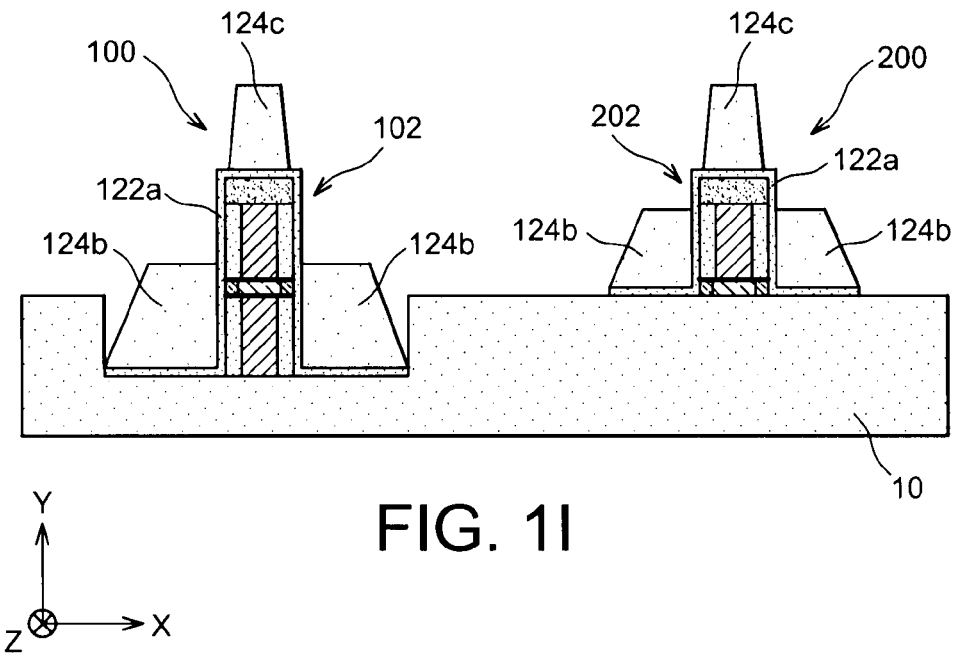
Figure 1J:
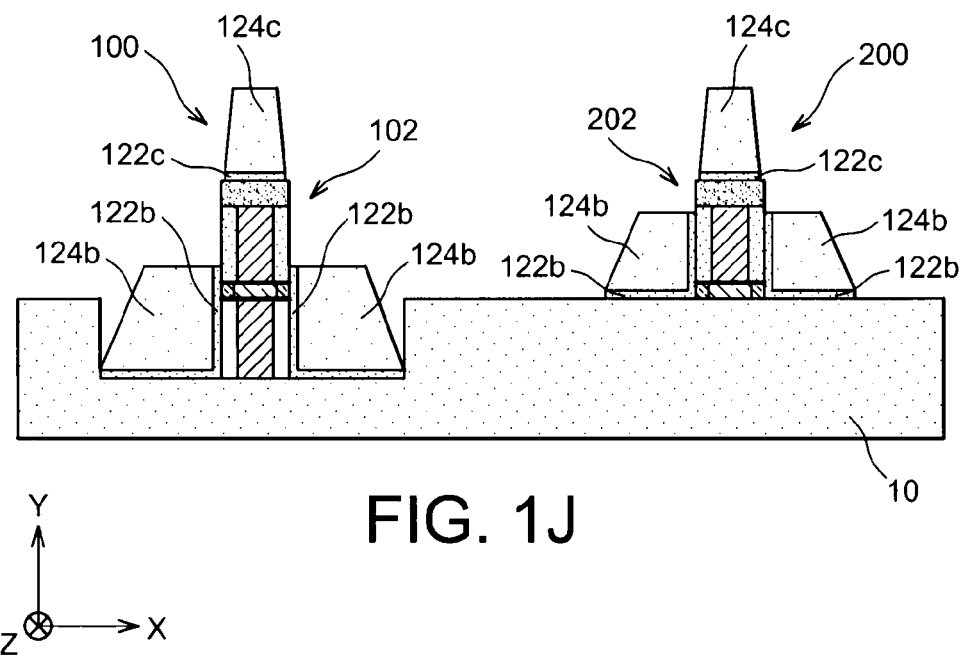
Figure 1K:
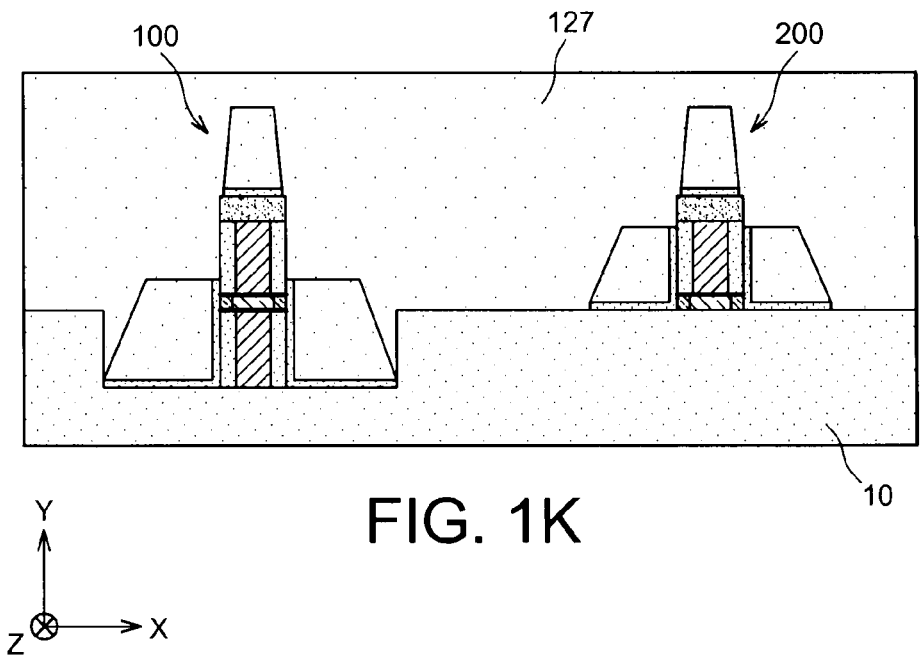
Figure 1L:
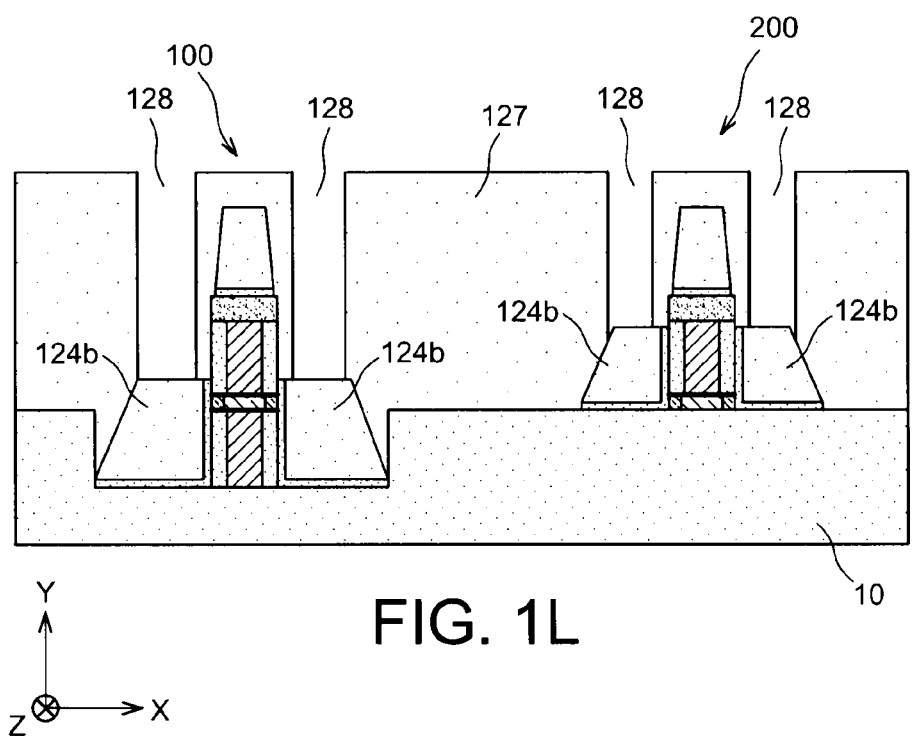
Figure 1M:
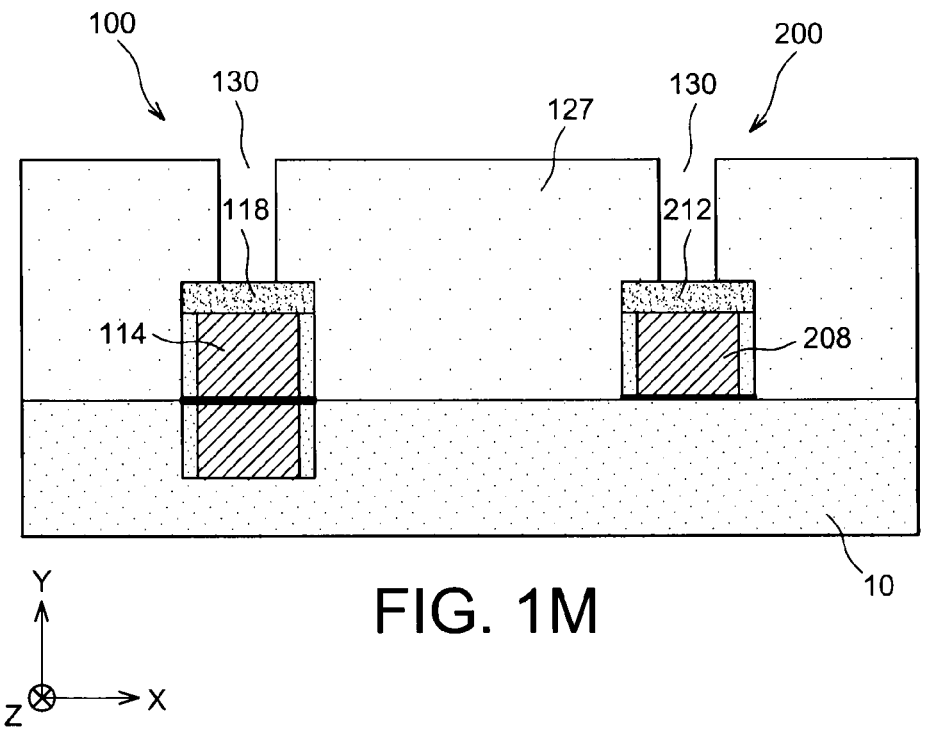
Figure 1N:
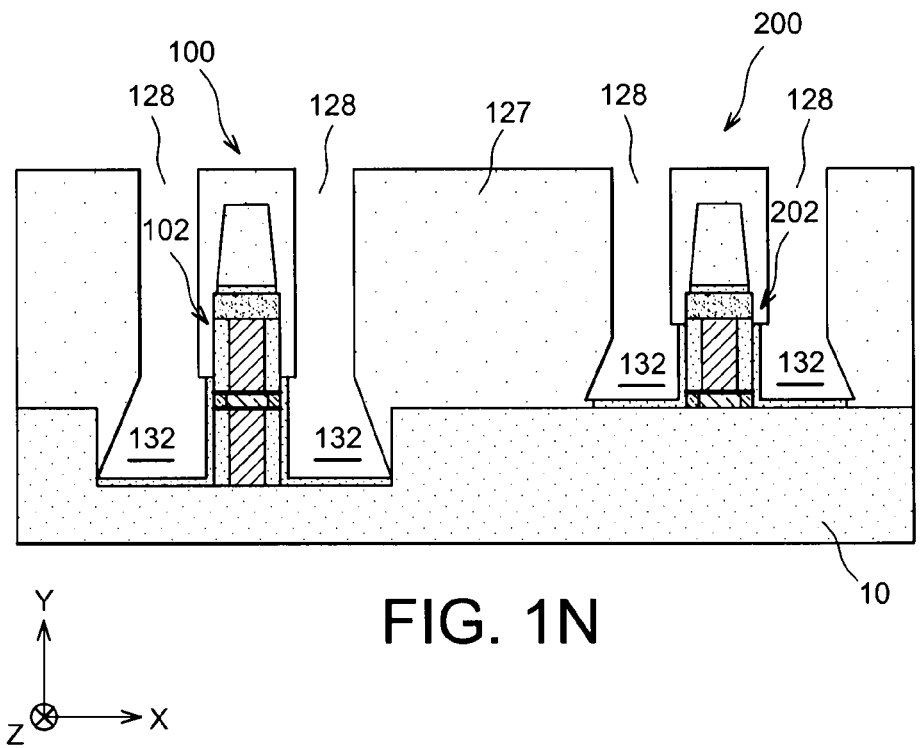
Figure 1O:
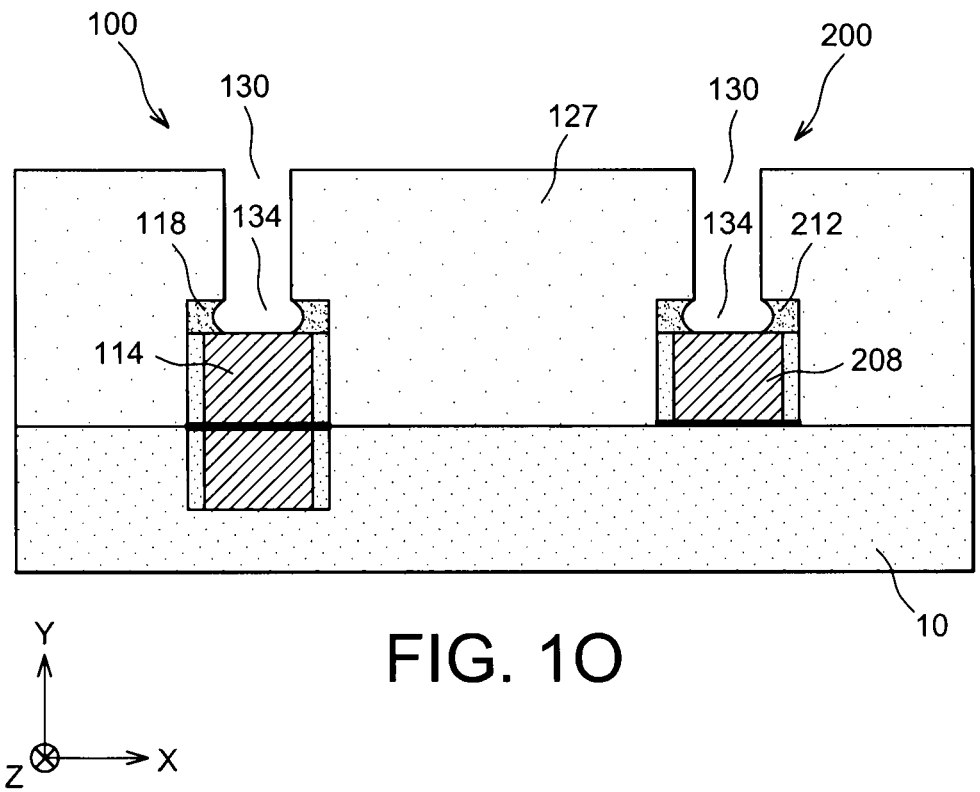
Figure 1P:
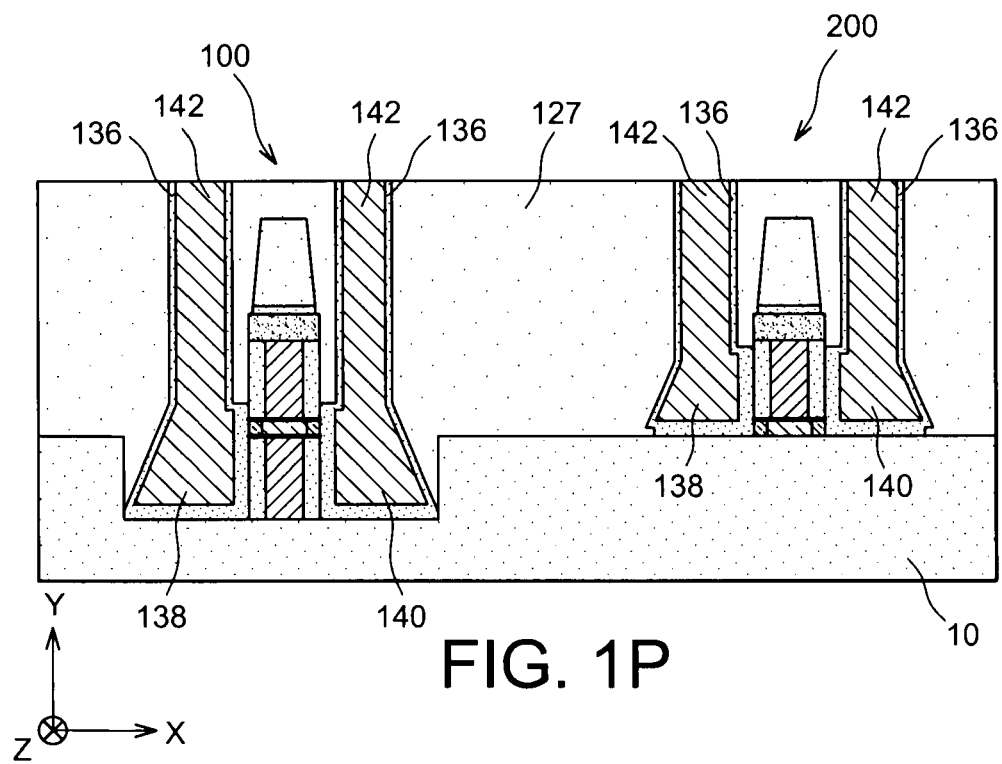
Figure 1Q:
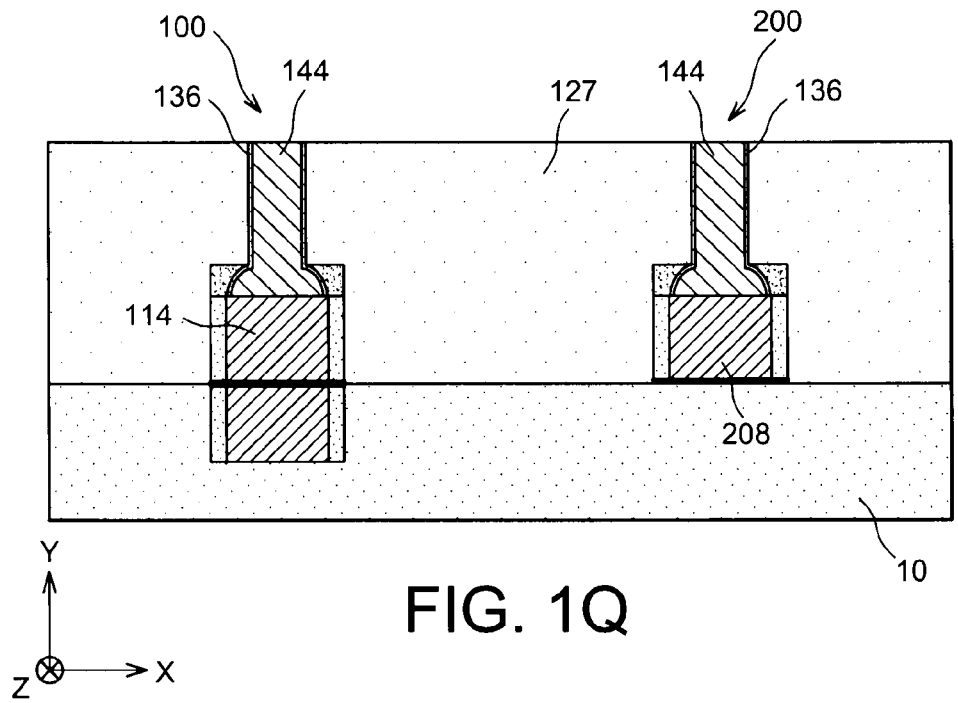

We first refer to FIGS. 1A to 1Q, which illustrate the steps of a method for producing transistors with metallic sources and drains according to a first embodiment. In these FIGS. 1A to 1Q, the production of a first self-aligned dual-gates transistor 100 and a second transistor 200 of the FD-SOI type is described. The two transistors 100, 200 are co-integrated here on a same SOI substrate including a massive semiconductor layer, not shown, on which a first dielectric material-based layer 10 is arranged, for example composed of $SiO_2$. Portions of semiconductor material, for example silicon- and/or germanium-based, are produced on the dielectric layer 10 to form the channel regions of the transistors 100, 200.

As shown in FIG. 1A, one first realizes, for the transistor 100, on a face 126 of the dielectric layer 10, a stack 102 including a lower gate 104, for example composed of a semiconductor such as polycrystalline SiGe, or a metal, surrounded by first lateral spacers 106, composed of at least one dielectric material such as $SiO_2$ and/or $Si_3N_4$ for instance. A first gate dielectric 108 is arranged on and against the lower gate 104 and the first spacers 106. This first gate dielectric 108 has for example a thickness (dimension along the Y axis) between about 1 and 5 nanometers and for example is composed of a "high-K" dielectric material, i.e. a material whereof the dielectric constant is greater than about 3.9, such as $HfO_2$ or $Al_2O_3$. A portion of semiconductor material 110 such as silicon and/or germanium, intended to form the channel of the transistor 100, is arranged on and against the first gate dielectric 108. Extension regions, realized by implantation of dopants and annealing, are formed at the lateral ends of the portion of semiconductor material 110. A second gate dielectric 112, for example of similar nature and/or dimensions to the first gate dielectric 108, is arranged on and against the semiconductor portion 110. An upper gate 114, for example composed of a semiconductor such as polycrystalline SiGe, or a metal, surrounded by second lateral spacers 116 for example composed of $SiO_2$ and/or $Si_3N_4$, is arranged on and against the second gate dielectric 112. Lastly, the stack 102 also includes a hard mask 118, for example composed of semiconductor nitride or semiconductor oxide such as $SiO_2$, arranged on and against the upper gate 114 and the second spacers 116.

This stack 102 is realized by implementing the steps of deposition, masking, lithography, etching and molecular adhesion of different layers composed of the different materials previously cited. The stack 102 may in particular be produced by implementing the steps described in document EP 1 788 635 A1. The stack 102 is produced in a recess 119 formed in the dielectric layer 10 whereof the depth (dimension along the Y axis) is here essentially equal to the sum of the thicknesses of the lower gate 104 (dimension along the Y axis) and the thickness of the first gate dielectric 108.

Parallel to the production of the stack 102 of the transistor 100, one produces, on the face 126 of the dielectric layer 10, a stack 202 of the transistor 200 including a portion of semiconductor material 204, for example silicon and/or germanium-based, intended to form the channel of the second transistor 200. The dimensions of the semiconductor portion 204 are for example similar to those of the semiconductor portion 110. Extension regions, realized by implantation of dopants and annealing, are formed at the lateral ends of the portion of semiconductor material 204. The stack 202 also includes a gate dielectric 206, for example with dimensions similar to those of the gate dielectrics 108, 112 and/or composed of a material similar to that of the gate dielectrics 108, 112, and arranged on and against the semiconductor portion 204.

The stack 202 also includes a gate 208 surrounded by lateral spacers 210, and on which a hard mask 212 is arranged. These elements for example have similar dimensions and/or are composed of materials to those of the upper gate 114, second spacers 116 and the hard mask 118 of the stack 102 of the transistor 100.

The stack 202 is produced by the implementation of the steps of deposition, masking, lithography and etching of layers of different materials forming the elements of the stack 202, pursuant to the traditional steps for producing a FD-SOI transistor, which will not be explained in detail here. Furthermore, the semiconductor deposited on the dielectric layer 10 to form the portion of semiconductor material 204 and which is outside the active region may be eliminated by a dry and selective etching relative to the spacers 210 and the hard mask 212, which makes it possible to subsequently optimize the formation of the silicide at the ends of the portion of semiconductor material 204.

FIG. 1B shows the stack 202 which may be produced according to an alternative of the first embodiment. Unlike the stack 202 of FIG. 1A, which includes lateral spacers 210 formed by portions of a single dielectric material, the stack 202 of FIG. 1B includes lateral spacers formed by several portions 214, 216 of different dielectric materials around the gate 208. Portions 214 directly in contact with the gate 208 for example are $SiO_2$-based, and portions 216, formed around portions 214, for example are $Si_3N_4$-based. Ends 220 doped by implantation of type N or P dopants form the so-called extension regions of the channel of the transistor 200. The stack 202 also includes portions 218 of semiconductor realized by epitaxy above extension regions 220. These epitaxied semiconductor portions make it possible to even further reduce the access resistance to the channel 204.

The different elements of this alternative (spacers including several portions of different dielectric materials, epitaxied semiconductor portions formed above the extension regions) may also be produced for the stack 102 of the transistor 100. Here again, these elements may be produced by implementing the steps described in document EP 1 788 635 A1.

FIG. 1C shows a top view of transistors 100 and 200. The axis AA shown in FIG. 1C corresponds to the cutting axis of the views of FIGS. 1A and 1B, which are cross-sectional views of transistors 100, 200 at their active regions.

As illustrated in FIG. 1D, one then performs a siliconization of ends 120 and 222 of the semiconductor portions 110 and 204, then a full wafer deposition of a barrier layer 122, for example TiN-based and intended to prevent the diffusion of corrosive elements (for example fluorine) released during later depositions of metal that will be done during the method for producing transistors 100, 200. This barrier layer 122 for example has a thickness of between about 5 nm and 40 nm, and for example equal to about 10 nm when the gate lengths are less than or equal to 20 nm, and is for example deposited by PVD (physical vapor deposition). In one alternative, the barrier layer 122 could also be composed of Ti—TiN, TaN, or any other material capable of forming a barrier to the corrosive elements released during metal depositions. The barrier layer 122 covers the face 126 of the dielectric layer 10 as well as the stacks 102, 202 of the transistors 100, 200. At this stage of the method, the barrier layer 122 forms a short circuit between the transistors 100 and 200, as well as short circuits internal to each transistor 100, 200, respectively between the ends 120 and 222 of the semiconductor portions 110, 204 of those transistors.

One then performs a non-conformal PECVD full wafer deposition of a nitride-based layer 124, for example SiN-based, on the transistors 100 and 200, covering the barrier layer 122 (FIG. 1E). This non-conformal deposition makes it possible to obtain a layer 124 whereof the dimension referenced "A" in FIG. 1E, along an axis parallel to a plane passing through the face 126 of the dielectric layer 10 on which the barrier layer 122 is deposited and on which the stacks 102, 202 of the transistor 200 are arranged, i.e. belonging to a plane parallel to the plane (X, Z) shown in FIG. 1E, is smaller than the dimension referenced "B" parallel to the Y axis of FIG. 1E, corresponding to the thickness of the layer 124. It is in particular possible to produce the layer 124 such that $B/A \geq 2$.

One produces the layer 124 such that it occupies at least the volume of the source and the drain of the transistors 100, 200 intended to be produced in the continuation of the method. This translates, for the transistor 100, to the fact that the thickness of the layer 124 (dimension "B") is greater than the sum of the thicknesses of the semiconductor portion 110, the first gate dielectric 108 and the gate 104. For the transistor 200, the thickness of the layer 124 (dimension "B") is greater than the thickness of the semiconductor portion 204.

In one alternative, this layer 124 could also be polysilicon-based or polycrystalline SiGe-based. It is also possible for the layer 124 to be obtained by implementing a conformal deposition. In this case, the dimensions B and A of the layer 124 will be essentially equal.

One then withdraws portions of the layer 124 found at the isolation regions of the transistors 100, 200, i.e. outside the active regions of the transistors 100, 200 forming the channels and the source and drain regions of these transistors 100, 200. This withdrawal is realized by the implementation of lithography and etching steps from an etching mask with dimensions essentially similar to or greater than those of the etching mask used to define the channel regions and the source and drain regions of the transistors 100, 200. The barrier layer 122 is used as etching stop layer. Thus, the gates, spacers and hard masks of the transistors 100, 200 found at the isolation regions of the transistors 100, 200 are not impacted by this etching. One thus obtains, for each transistor 100, 200, a remaining portion 124a of the layer 124 covering the stack 102, 202 and the locations of the source and of the drain of the transistor. The portions of the barrier layer 122 found at the isolation zones of the transistors 100, 200 are then removed as shown in FIGS. 1F to 1H (FIG. 1H is a top view of the transistors 100, 200 after the implementation of this etching, FIGS. 1F and 1G being cross-sectional views along axes AA and BB, respectively, illustrated in FIG. 1H, i.e. active regions and isolation regions of the transistors 100, 200, respectively). One thus obtains, for each transistor 100, 200, a remaining portion 122a of the barrier layer 122 covering the stack 102, 202 and the locations of the source and of the drain of the transistor.

As illustrated in FIG. 1I, isotropic etching of the remaining portion 124a of the layer 124 is done, for example dry plasma etching with HBr or $SF_6$, on the transistors 100 and 200, revealing, or stripping, a portion of the barrier layer 122. One thus obtains, for each transistor, two portions 124b of the layer 124 whereof the volumes essentially correspond to the volumes of the future sources and drains of the transistors 100, 200. Another portion 124c is also kept at the apex of each of the stacks 102, 202. As illustrated in FIG. 1J, one then performs isotropic etching, for example by plasma (from a chlorinated chemistry such as $BCl_3$, $Cl_2$) or chemically (HCl+ $H_2O_2$), of the remaining portions 122a of the barrier layer 122 in order to eliminate the short circuit formed by the remaining portions 122a of the material of the barrier layer 122 surrounding the stacks 102, 202 of the transistors 100, 200. One therefore performs the etching of the portions of the barrier layer 122 revealed by the preceding step of etching of the remaining portions 124a of the layer 124. Preferably, the portions of the barrier layer 122 in contact with the ends 120 and 222 of the channels of the transistors 100, 200 should not be removed in order to protect those channels during later metal depositions. One therefore obtains two disjointed portions 122b of material capable of forming a diffusion barrier, not electrically connected to each other and each covering one of the locations of the source or drain, for each transistor. Furthermore, a third portion 122c is kept between each stack 102, 202 and the portions 124c of the layer 124.

This first embodiment is particularly adapted for producing FD-SOI transistors because as shown by FIG. 1I, the risk of withdrawing the portions of the barrier layer 122 found in contact with the ends 222 of the channel of the transistor 200 is minimal given the fact that the portions of the barrier layer 122 that are eliminated are relatively remote from the channel of the transistor 200.

One then performs a full wafer deposition and a chemical-mechanical planarization with time-stop of a second dielectric material-based layer 127 on the transistors 100, 200, for example oxide-based (FIG. 1K). The thickness of the dielectric layer 127 is for example about three time greater than the thickness of the stack 102 or 202 of the transistors 100, 200 (for readability reasons, the dielectric layer 127 is shown in FIG. 1K with a thickness less than three times the thickness of the stack 102 or 202).

As illustrated in FIG. 1L, one then produces, through lithography and etching steps, first holes 128 at the active regions of the transistors 100, 200, forming accesses to the portions 124b of the layer 124 occupying the volume of the future source and drain regions of the transistors 100, 200. Given that the portions 124b of the layer 124 are intended to be completely eliminated at the end of the method for producing the transistors 100, 200, it is not necessary to have great selectivity of etching between the material of the layer 124 and the material of the dielectric layer 127. In the example of FIG. 1L, two holes 128 are realized for each of the transistors 100, 200 in order to access the two portions 124b. The geometry of the contact holes 128 corresponds to the future electric contacts of the sources and drains of the transistors 100, 200 that will be produced subsequently. These lithography and etching steps also make it possible to produce, at the isolation regions of the transistors 100, 200, second contact holes 130 at the transistor gates 100, 200 (see FIG. 1M). This etching is done with stop on the hard masks 118, 212 formed above the gates of the transistors 100, 200 when the hard masks are nitride-based (as is the case in FIG. 1M), or with stop on the gates 114, 208 when the hard masks 118, 212 are semiconductor oxide-based or amorphous carbon-based (with a tolerance of a certain consumption of the gate material).

One then eliminates, for example through isotropic etching, the portions 124b of the layer 124 found at the active regions of the transistors 100, 200, thereby forming cavities 132 in which the source and drain regions are intended to be produced (FIG. 1N). Etching, for example dry plasma etching with HBr or $SF_6$, allows selective etching of the portions 124b of the layer 124, here SiN-based, relative to the other materials present (oxides, TiN, metal-silicon or metal-germanium alloy). The material of the layer 124 is therefore chosen in order to be able to selectively etch it relative to the other materials present, and in particular the second dielectric material of the layer 127. It is for example possible to have the material of the layer 124 presenting an etching selectivity factor at least equal to 30 relative to the other materials present, i.e. the etching speed of which is at least 30 times greater than the etching speed of the other materials of the transistor. The width (dimension along the X axis) of the cavities 132 is for example equal to about 2.5 times the width of the stack 102 or 202. Moreover, the height (dimension along the Y axis) of the cavities 132 is for example less than the height of the stacks 102 or 202. Moreover, as illustrated in FIG. 1O, this isotropic etching is also realized at the isolation regions of the transistors 100, 200, etching portions of the hard masks 118, 212 and forming accesses 134 to the upper gate 114 of the transistor 100 and to the gate 208 of the transistor 200.

As shown in FIG. 1P, one completes the realization of the transistors 100 and 200 by depositing, against the walls of the cavities 132 and the contact holes 128, a barrier layer 136, for example composed of TiN, Ti—TiN or TaN. This barrier layer 136 is for example formed by selective deposition, for example of the ALD type ("Atomic Layer Deposition"), an electrolytic deposition or a deposition of the MOCVD-type (metal-organic chemical vapor deposition), thereby making it possible to deposit the barrier layer 136 on the walls of the cavities 132 and holes 128 without filling in the holes 128 before the walls of the cavities 132 are completely covered with the barrier layer 136. After the deposition of the barrier layer 136 on the walls of the cavities 132 and holes 128, the remaining volume of the cavities 132 and of the holes 128 is filled with a metallic material, for example tungsten or copper, forming metallic sources 138 and drains 140 of the transistors 100, 200, as well as metallic contacts 142 electrically connected to the sources 138 and drains 140 of the transistors 100, 200. Furthermore, these steps also enable the production of the barrier layer 136 on the walls of the second contact holes 130 and accesses 134 to the gates 114, 208, as well as metallic contacts 144 connected to the gates 114, 208, at the isolation regions of the transistors 100, 200 (FIG. 1Q). The metallic material exceeding the contact holes 128 and 130 as well as the metallic material found on the dielectric layer 127 is eliminated, for example by chemical-mechanical planarization with stop on the dielectric layer 127.

In one alternative of this first embodiment, it is also possible not to perform the deposition of the barrier layer 122, but only to produce the barrier layer 136 after producing the contact holes 128 and eliminating the portions 124, by deposition of the MOCVD or ALD type.

Although the first embodiment of the method for producing transistors with metallic sources and drains was described for two transistors 100 and 200 co-integrated on a same substrate, it is also possible for this method to be implemented for a single type of transistor that is not co-integrated with another type of transistor.

Furthermore, in an alternative of this first embodiment, it is possible for the hard masks 118, 212 to be eliminated from the stacks 102 and 202 before the step of deposition of the barrier layer 122, which makes it possible to carry out, before deposition of the barrier layer 122, a siliconization of the transistor gates 100, 200. This alternative is possible given that the hard masks 118, 212 do not serve as stop layers for planarization steps.

We will now refer to FIGS. 2A to 2K, which illustrate steps of a method for producing transistors 300, 400 with metallic sources and drains according to a second embodiment. As for FIGS. 1A to 1Q, this method according to the second embodiment is described here for the production of a first self-aligned dual-gates transistor 300 and a second transistor 400 of the FD-SOI type, these two transistors 300, 400 being co-integrated on a same SOI substrate including, similarly to the first embodiment previously described, a massive semiconductor layer, not shown, on which the first dielectric material-based layer 10, for example composed of $SiO_2$, is arranged.

Similarly to the first embodiment, one first performs the steps previously described in connection with FIGS. 1A to 1H, making it possible to obtain transistors 300, 400 respectively including the stacks 102 and 202 covered, at their active regions, by the remaining portion 122a of the barrier layer 122 and the remaining portion 124a of the layer 124. Here again, the layer 124 may also be obtained through the implementation of a conformal or non-conformal deposition.

Figure 2A:
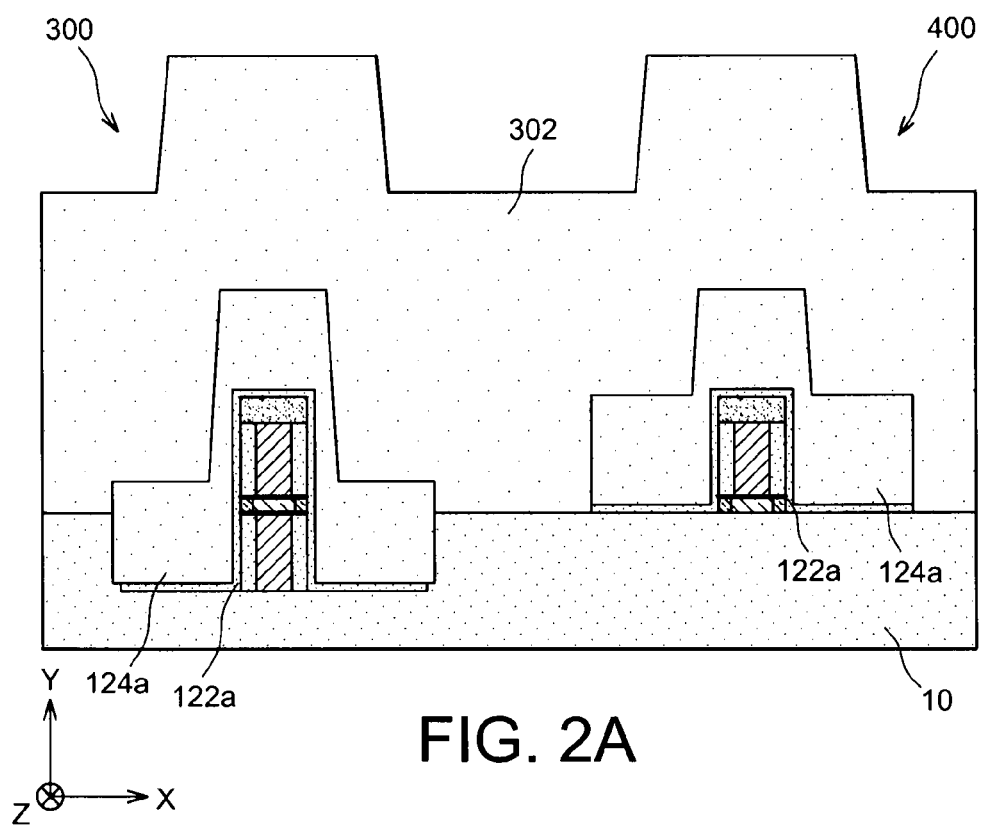
FIGS. 2A to 2K illustrate steps of a method for producing transistors with metallic source and drain according to a second embodiment.

As illustrated in FIG. 2A, one performs a full wafer deposition of a second dielectric material-based layer 302, for example composed of silica, covering the dielectric layer 10 as well as the remaining portions 124a of the layer 124.

Figure 2B:
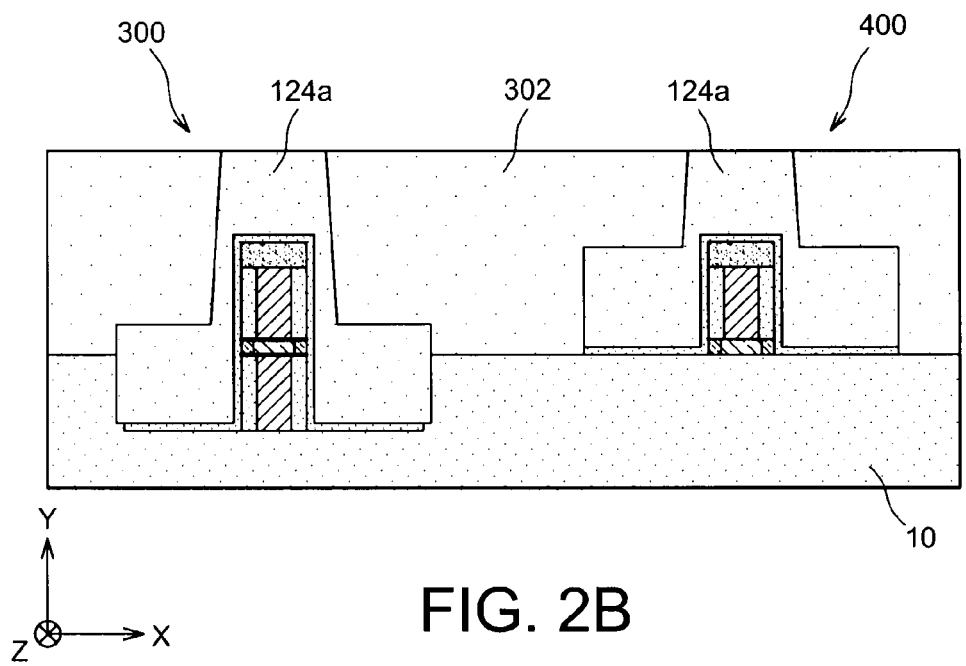
Figure 2C:
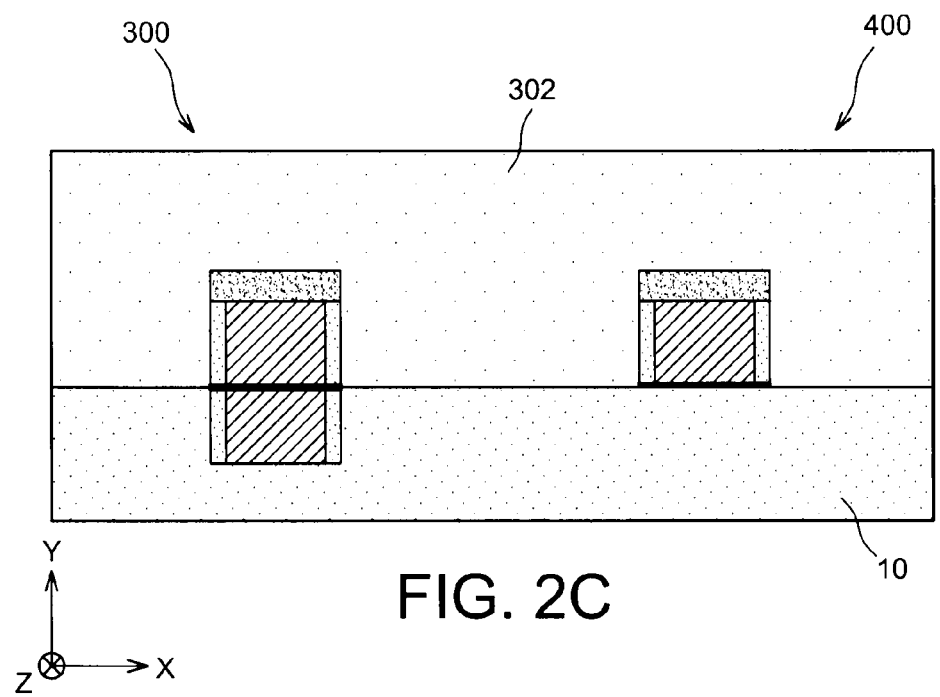

One then performs a chemical-mechanical planarization of the dielectric layer 302 with stop on the apex of the remaining portions 124a of the layer 124 (FIGS. 2B and 2C illustrating the active regions and the isolation regions, respectively, of the transistors 300, 400).

Figure 2D:
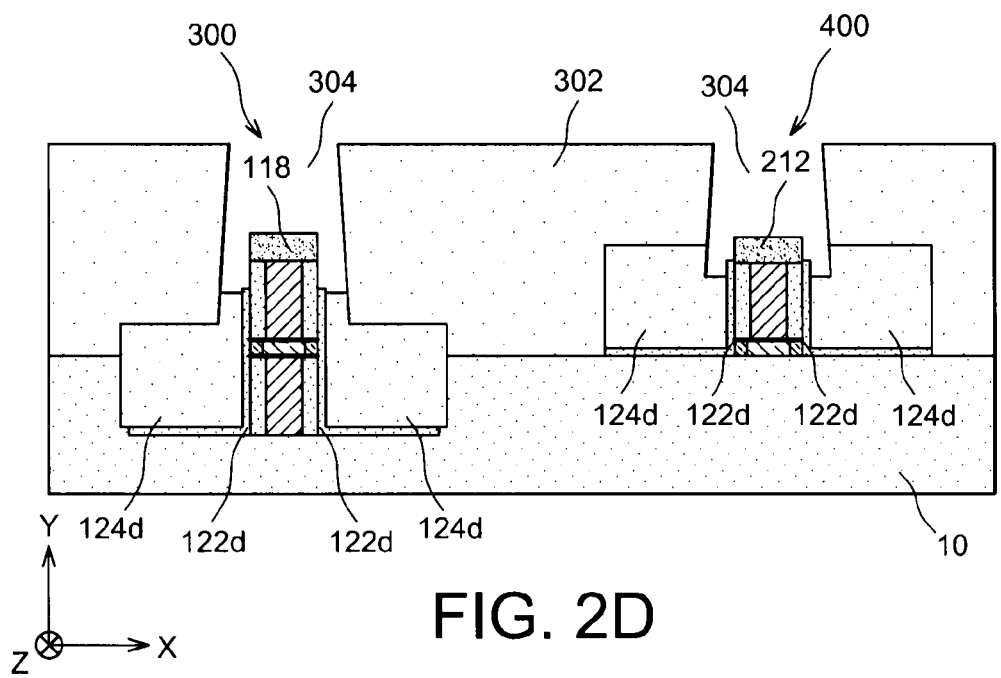

As shown in FIG. 2D, one then performs etching, for example dry etching, of the remaining portions 124a of the layer 124, forming, at the active regions of the transistors 300, 400, trenches 304 above the hard masks 118, 212, in order to partially strip the remaining portions 122a of the barrier layer 122. The remaining portions 124a of the isolation layer 124 are for example etched by plasma dry etching with HBr or $SF_6$. In the example FIG. 2D, one performs an over-etching of the remaining portions 124a in order to release the remaining portions 122a of the barrier layer 122 found on the upper portions of the lateral sides of the stacks 102, 202. One obtains, for each of the transistors 300, 400, portions 124d arranged at the locations of the source and the drain of each transistor, the volume of each of the two portions 124d of material corresponding essentially to the volume of the source or the drain of each transistor.

One then etches the remaining portions 122a of the barrier layer 122 which were stripped by the preceding etching step. This etching of the barrier layer 122 is for example done by plasma (from a chlorinated chemistry such as $BCl_3$, $Cl_2$) or chemically ($HCl+H_2O_2$). One therefore obtains, for each stack 102, 202, two disjointed portions 122d of material capable of forming a diffusion barrier, not electrically connected to each other and each covering one of the locations of the source or the drain, for each transistor. When the hard masks 118, 212 are semiconductor oxide—or amorphous carbon-based, this etching may then be done with stop on the gates 114, 208 of the transistors 100, 200.

Figure 2E:
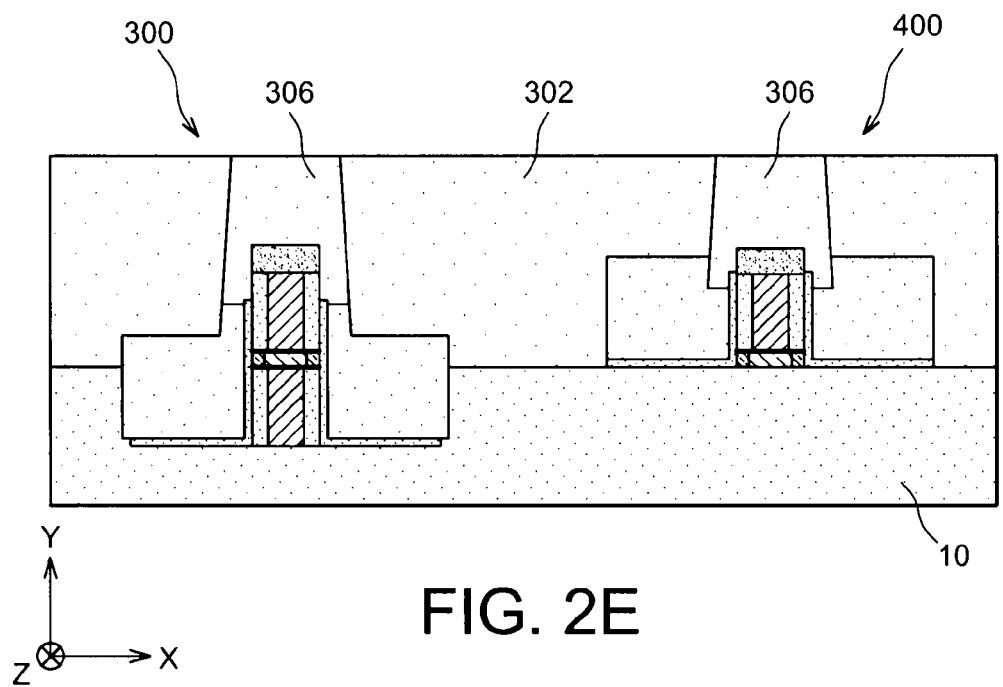

A second dielectric layer 306 is then deposited, then planarized in order to plug the trenches 304 previously formed at the active regions of the transistors 300, 400 (FIG. 2E).

Figure 2F:
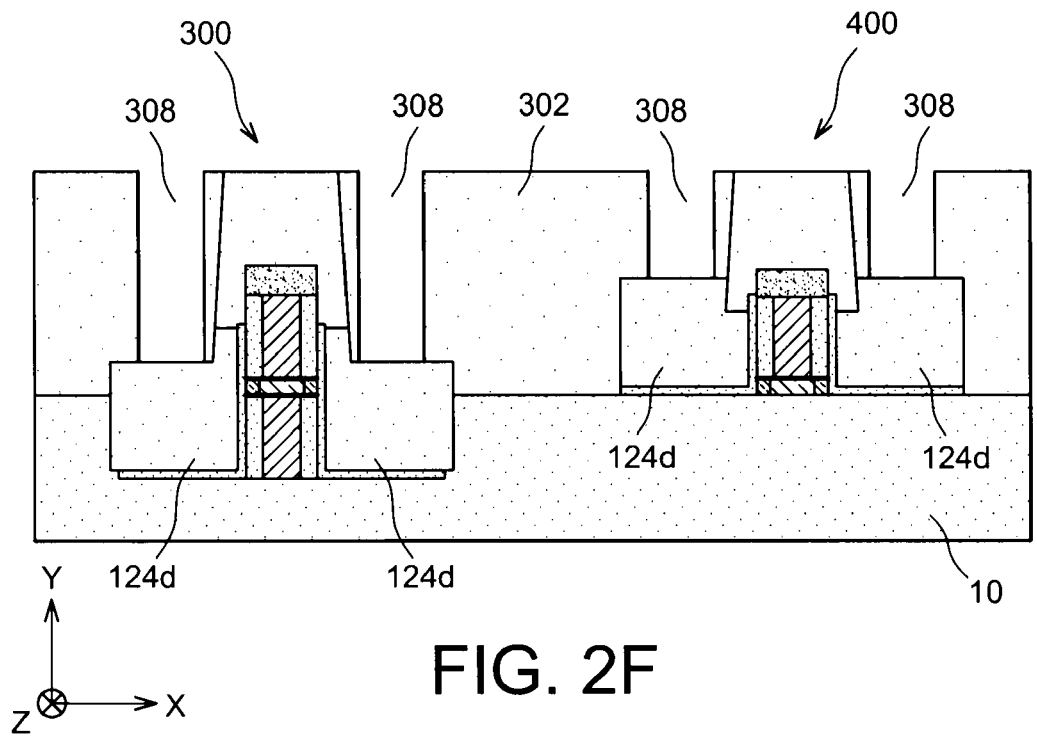
Figure 2G:
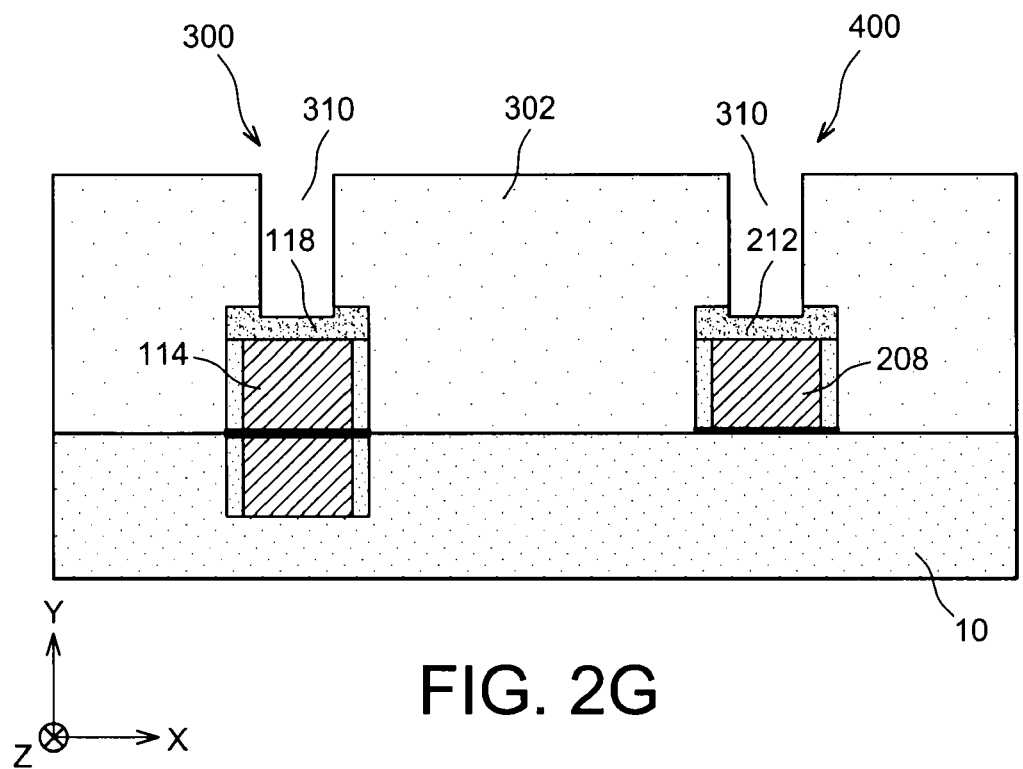

The method for producing transistors 300, 400 is then completed similarly to the method for producing the transistors 100, 200 previously described. Thus, one realizes through lithography and etching steps, first contact holes 308 at the active regions of the transistors 300, 400, forming accesses to the portions 124d of the layer 124 occupying the volume of the future source and drain zones of the transistors 300, 400 (FIG. 2F). The geometry of the contact holes 308 corresponds to the future electric contacts of the sources and drains of the transistors 300, 400 which will subsequently be produced. These lithography and etching steps also make it possible to produce, at the isolation zones of the transistors 300, 400, second contact holes 310 at the transistor gates 300, 400 (see FIG. 2G). This etching is done with stop on the hard masks 118, 212 formed above the gates 114, 212 of the transistors 300, 400 when the hard masks are nitride-based (as is the case in FIG. 2G), or with stop on the gates 114, 208 when the hard masks 118, 212 are semiconductor oxide—or amorphous carbon-based.

Figure 2H:
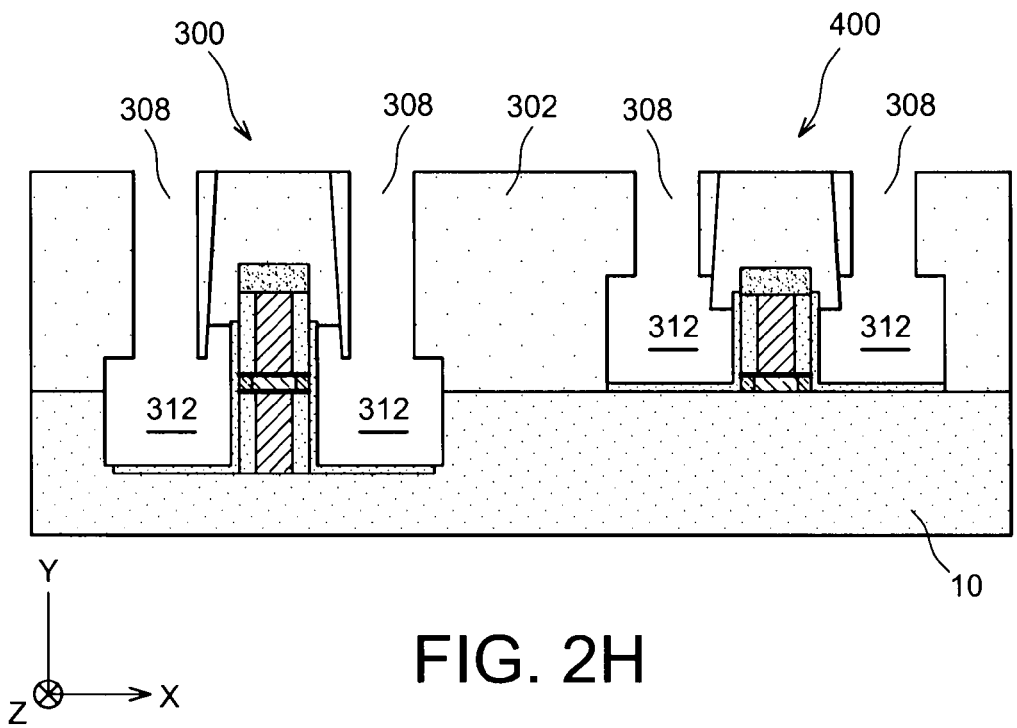
Figure 2I:
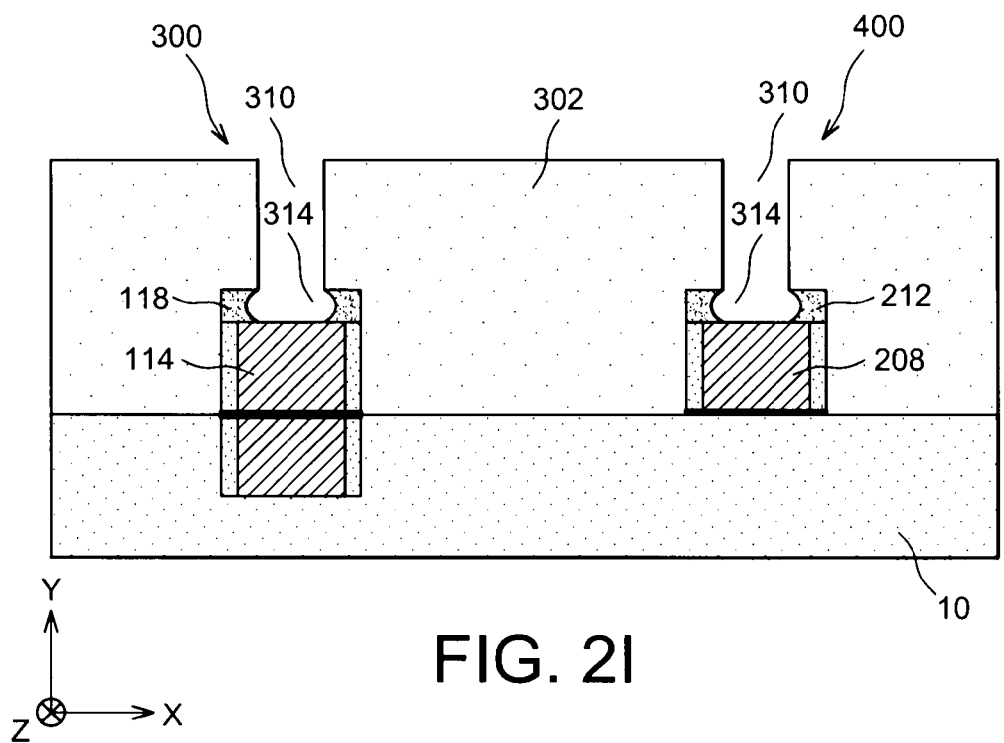

One then eliminates, for example by isotropic etching, the portions 124d of the layer 124 found at the active regions of the transistors 300, 400, thereby forming cavities 312 in which the sources and the drains of the transistors are intended to be realized (FIG. 2H). Moreover, as illustrated in FIG. 2I, this isotropic etching is also done at the isolation regions of the transistors 300, 400, etching portions of the hard masks 118, 212 and forming accesses 314 to the upper gate 114 of the transistor 300 and to the gate 208 of the transistor 400.

Figure 2J:
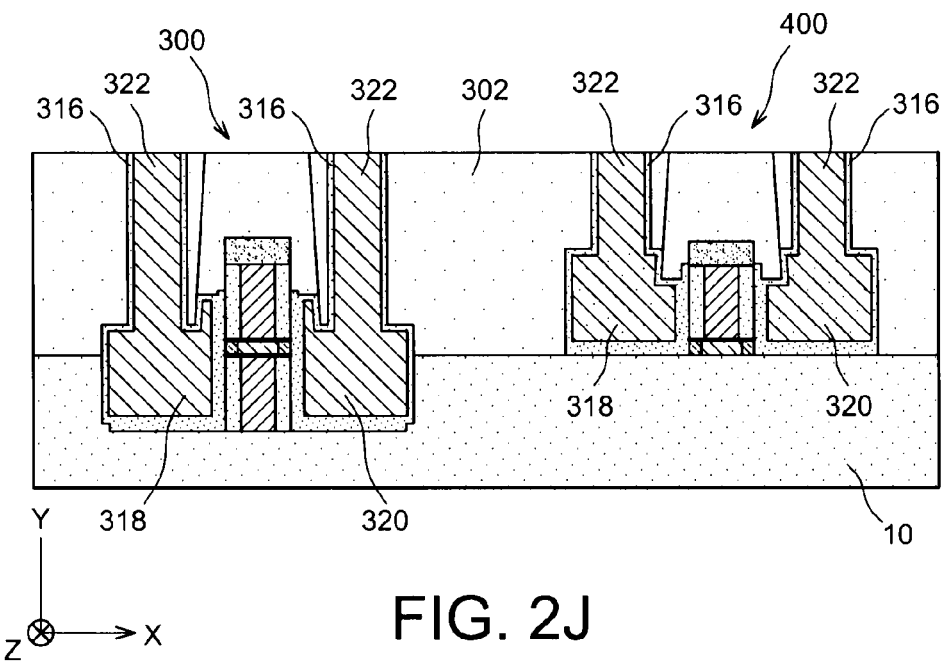
Figure 2K:
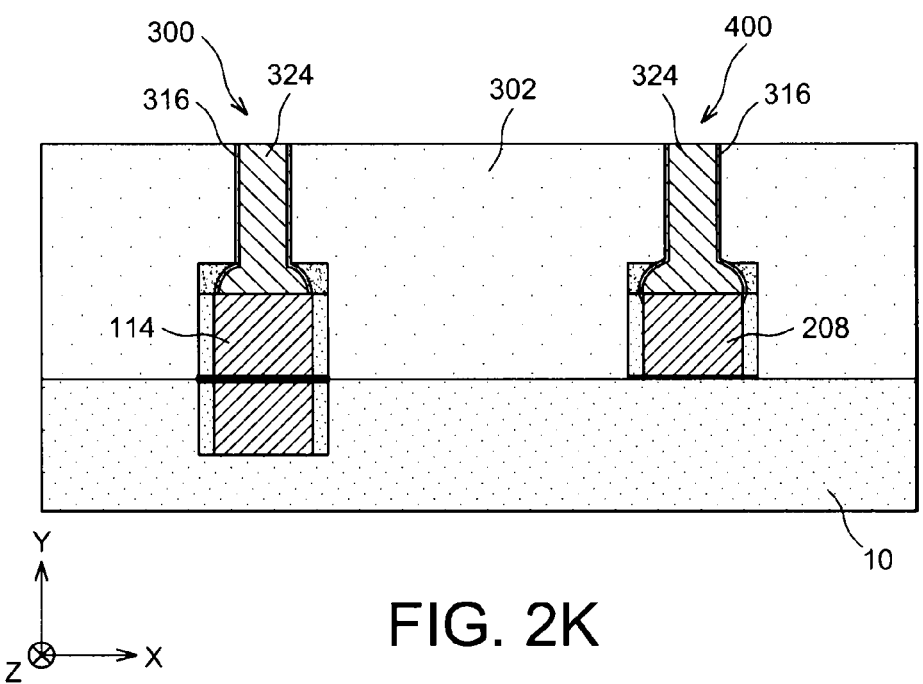

As shown in FIG. 2J, one completes the production of the transistors 300 and 400 by depositing, against the walls of the cavities 312 and contact holes 308, a barrier layer 316, for example composed of TiN, Ti—TiN or TaN. This barrier layer 316 is for example formed by a selective deposition, for example of the ALD type, an electrolytic deposition or a deposition of the MOCVD type. After the deposition of the barrier layer 316 on the walls of the cavities 312 and holes 308, the remaining volume of the cavities 312 and holes 308 is filled in with a metallic material, for example tungsten or copper, forming metallic sources 318 and drains 320 of the transistors 300, 400, as well as metallic contacts 322 electrically connected to the sources 318 and drains 320 of the transistors 300, 400. Furthermore, these steps also make it possible to produce the barrier layer 316 on the walls of the second contact holes 310 and accesses 314 to the gates 114, 208, as well as the metallic contacts 324 connected to the gates 114, 208, at the isolation regions of the transistors 300, 400. The metallic material exceeding the contact holes 308 and 310 as well as the metallic material found on the oxide layer 302 is eliminated, for example by chemical-mechanical planarization with stop on the oxide layer 302.

The alternatives previously described in connection with the first embodiment may also apply to the second embodiment.

The invention claimed is:

1. A method for producing a transistor with metallic source and drain including at least the steps of:
   a) producing, on one face of a first dielectric material-based layer, at least one stack comprising at least one portion of at least one semiconductor material designed to form a channel of the transistor, a gate dielectric arranged against the portion of semiconductor material and a gate arranged against the gate dielectric,
   b) producing, on the face of the first dielectric material-based layer, at least two portions of a material capable of being selectively etched relative to at least one second dielectric material and arranged at the locations of the source and drain of the transistor, the volume of each of said two portions of material corresponding at least to the volume of the source or of the drain of the transistor,
   c) producing a second dielectric material-based layer covering at least the stack and said two portions of material,
   d) producing at least two holes in the second dielectric material-based layer, each hole forming an access to one of said two portions of material,
   e) etching said two portions of material, forming two cavities whereof the volumes correspond to the volumes of the source and of the drain of the transistor,
   f) depositing at least one metallic material in said two cavities, forming at least the metallic source and drain of the transistor,
   and also including, between steps a) and b), a step of depositing, on the stack, against the lateral sides of the stack and against the face of the first dielectric material-based layer, a layer composed of a material capable of forming a barrier to a diffusion of corrosive elements released during a metal deposition, said two portions of material being produced, during step b), against the layer composed of the material capable of forming a diffusion barrier.

2. The method according to claim 1, wherein step b) for producing said two portions of material is obtained by carrying out the following steps:
   deposition of a layer composed of the material capable of being selectively etched relative to the second dielectric material on the face of the first dielectric material-based layer and on the stack,
   etching of the layer composed of the material capable of being selectively etched relative to the second dielectric material, a remaining portion of said layer composed of the material capable of being selectively etched relative to the second dielectric material covering the stack and the locations of the source and the drain, etching of said remaining portion, forming said two portions of material.

3. The method according to claim 2, wherein the deposition of the layer composed of the material capable of being selectively etched relative to the second dielectric material is of the non-conformal PECVD type.

4. The method according to claim 2, also including, between the step of etching of the layer composed of the material capable of being selectively etched relative to the second dielectric material and the step of etching of said remaining portion, the performance of the following steps:
- deposition of a first layer composed of the second dielectric material, covering at least said remaining portion,
- chemical-mechanical planarization of the first layer composed of the second dielectric material with stop on said remaining portion,
- step c) for producing the second dielectric material-based layer corresponding to a deposition of a second layer composed of the second dielectric material in a trench formed during the etching of said remaining portion and on the first layer composed of the second dielectric material, and a planarization of the second layer composed of the second dielectric material.

5. The method according to claim 2, also including, between the step of etching of the layer composed of the material capable of being selectively etched relative to the second dielectric material and the step of etching of said remaining portion, and before the step of depositing a first layer composed of the second dielectric material covering at least said remaining portion when the method includes such a step, a step of etching of the layer composed of the material capable of forming a diffusion barrier, a remaining portion of the layer composed of the material capable of forming a barrier covering the stack and the locations of the source and the drain.

6. The method according to claim 2, also including, between the step of etching of said remaining portion forming said two portions of material and step c) for producing the second dielectric material-based layer, a step of etching of the layer composed of the material capable of forming a diffusion barrier or the remaining portion of said layer, producing at least two disjointed portions of material capable of forming a diffusion barrier each covering one of the locations of the source or of the drain.

7. The method according to claim 2, in which the step of etching of said remaining portion forming said two portions of material is an isotropic etching.

8. The method according to claim 1, wherein one dimension of each of said two portions of material along an axis perpendicular to a plane passing through said face of the first dielectric material-based layer is smaller than a dimension of the stack along said axis.

9. The method according to claim 1, wherein the material capable of being selectively etched relative to the second dielectric material is also capable of being selectively etched relative to the materials present on the first dielectric material-based layer before the performance of etching step e), and/or is composed of SiN and/or silicon and/or germanium.

10. The method according to claim 1, wherein the material capable of forming a diffusion barrier is composed of TiN and/or Ti and/or TaN.

11. The method according to claim 1, wherein the stack also includes a hard mask arranged against the gate.

12. The method according to claim 1, wherein the transistor is of the FD-SOI type.

13. The method according to claim 1, wherein the stack also includes a second gate arranged against the first dielectric material-based layer and a second gate dielectric arranged between the second gate and the portion of semiconductor material.

14. The method according to claim 1, wherein the metallic material deposited during step f) is also deposited in the two holes formed in the second dielectric material-based layer, forming metallic contacts electrically connected to the source and to the drain of the transistor.

* * * * *